United States Patent [19]

Blossfeld

[11] Patent Number: 4,483,738
[45] Date of Patent: Nov. 20, 1984

[54] METHOD FOR MANUFACTURING BIPOLAR PLANAR TRANSISTORS

[75] Inventor: Lothar Blossfeld, Freiburg-Hochdorf, Fed. Rep. of Germany

[73] Assignee: ITT Industries, Inc., New York, N.Y.

[21] Appl. No.: 576,866

[22] Filed: Feb. 3, 1984

[30] Foreign Application Priority Data

Feb. 12, 1983 [EP] European Pat. Off. ........ 82101346.1

[51] Int. Cl.$^3$ ...................... H01L 7/44; H01L 27/02; B44C 1/22; C03C 15/00
[52] U.S. Cl. .................. 156/653; 29/576 B; 148/187; 156/657; 156/659.1; 357/40; 357/91; 430/313
[58] Field of Search ............ 148/1.5, 187, 188; 29/569 R, 571, 576 R, 576 B, 583; 427/85, 88; 156/645, 659.1, 653, 662, 657; 357/40, 41, 43, 58, 65, 91; 430/313, 329

[56] References Cited

U.S. PATENT DOCUMENTS 4,298,402 11/1981 Hingarh ........................ 156/653 X
4,347,654 9/1982 Allen et al. ...................... 156/653 X Primary Examiner—William A. Powell
Attorney, Agent, or Firm—Donald J. Lenkszus

[57] ABSTRACT

A method of manufacturing bipolar transistors is described. The emitter areas are protected by means of an oxidation masking layer and subsequently after applying a photo-resist layer which defines the base areas two implantation processes of ions of the base zone conductivity type are performed. The one is performed with low doping dose and high acceleration voltage sufficient to render the masking layer penetrable and the other with high doping dose and low acceleration voltage as to render the masking layer impenetrable.

6 Claims, 4 Drawing Figures

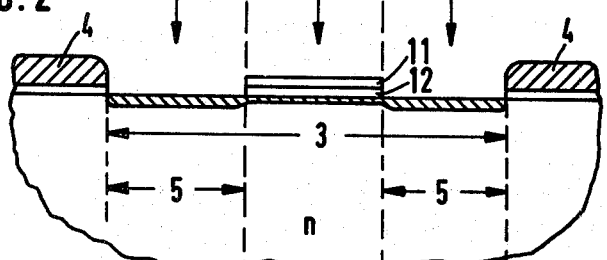
FIG. 1
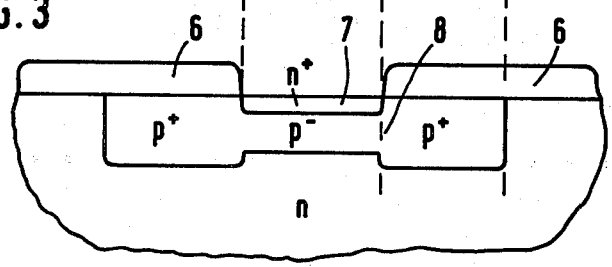
FIG. 2
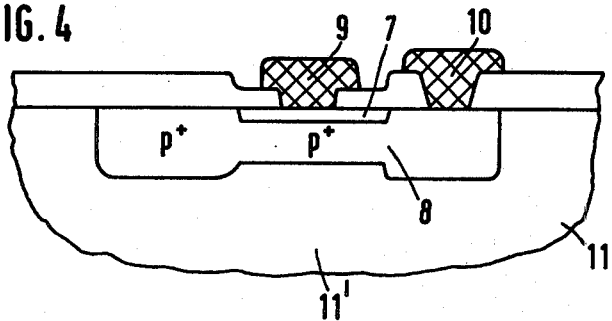
FIG. 3
FIG. 4

METHOD FOR MANUFACTURING BIPOLAR PLANAR TRANSISTORS

BACKGROUND OF THE INVENTION

The invention relates to a method for manufacturing bipolar planar transistors.

The conventional method such as described in "Genschow, Technischer Informationsdienst, Sonderausgabe Halbleiter", (April 1972) has the disadvantage that the current gain values of the transistors which are manufactured in semiconductor wafers which are divided into the solid-state circuits, are subjected to variations from wafer to wafer.

The invention is based on the recognition that variations of the aforementioned current gain or Beta values may be lowered to a range of a few percent when the manufacturing processes are selected and conducted such that the total amount of charge carriers becomes precisely controllable in the intrinsic base zones, that is, in the area of the base zone below the emitter zone, and also if non-compensated emitter zones are used. A non-compensated emitter zone, according to the "1979 International Electronic Device Meeting, Technical Digest", pp. 514 1 to 517 offers the advantage that relatively high current gain values and increased cutoff frequencies become possible. It was found that such emitter zones likewise contribute to low noise.

SUMMARY OF THE INVENTION

It is an object of the invention, to provide a bipolar planar transition manufacturing method which reduces to a minimum the scattering of the current gain values of the planar transistors throughout semiconductor wafers.

In accordance with the invention a method of manufacturing bipolar transistors is described. The emitter areas are protected by means of an oxidation masking layer and subsequently after applying a photoresist layer which defines the base areas two implantation processes of ions of the base zone conductivity type are performed. The one is performed with low doping dose and high acceleration voltage sufficient to render the masking layer penetrable and the other with high doping dose and low acceleration voltage as to render the masking layer impenetrable.

As the material for the oxidation masking layer there is preferably used silicon nitride or a layer of silicon dioxide covered with a layer of silicon nitride. In this case it is suitable to use as the material for the etch-masking layer, with which the outer base area is covered, a layer of silicon dioxide which, for example, is practically non-etchable by hot phosphoric acid which is used as the etching agent for silicon nitride.

BRIEF DESCRIPTION OF THE DRAWINGS

The method according to the invention as well as the advantages thereof, will now be explained with reference to FIGS. 1 to 4 of the accompanying drawings, in which:

FIGS. 1 to 4, are cross-sectional views taken almost vertically in relation to the main surface area of a plate-shaped semiconductor body at different stages in the manufacturing process according to the invention.

DETAILED DESCRIPTION

As shown in FIG. 1, a method in accordance with the invention starts from an n-doped plate-shaped silicon semiconductor body. On the one surface side thereof oxidation masking layers 1 of silicon nitride are deposited. Instead of uniform silicon-nitride layers, it is also possible to use multilayer structures topped by layers of silicon nitride 11. The materials are to be selected in such a way that the oxidation masking layers 1 are selectively etchable with respect to the etch-masking layers 6 to be deposited later on (cf. FIG. 3).

After that, and as shown in FIG. 2, a photoresist mask 4 is deposited which leaves free or defines the intrinsic base area 2.

In the subsequent two steps of implanting p-doped impurities, which may be carried out in any optional order of succesion, there is obtained the arrangement as shown in FIG. 2. In one of the two steps, at a relatively small acceleration energy, there are implanted doping ions into the exposed outer extrinsic base area 5 outside the emitter area 2. In the others of the two steps at a relatively high acceleration energy, e.g., 100 to 200 keV, sufficient to penetrate the oxidation masking layer portion 1, doping ions of the same conductivity type are implanted into the total-base area 3 including the emitter area 2. Preferably, the high-energy implantation is effected with small dose of about $10^{12}$ to $10^{13}$ cm$^{-2}$ and the relatively low-energy implantation, e.g., 10 to 100 keV is effected at a comparatively substantially increased dose to obtain a low base resistance.

After the extrinsic base areas 5 have been covered with the masking layer 6 by way of thermal oxidation, the semiconductor wafer is exposed to an etching agent, in particular to hot phosphoric acid which selective attacks the silicon nitride, so that the oxidation masking layer portions 2 are removed in the way as shown in FIG. 3.

The relatively thin silicon oxide layer 12 of the oxidation masking layer which, if so required, may be lying below the nitride layer 11, can be selectively removed by being momentarily dipped into a silicon oxide etching agent. After this, n-doping impurities of the conductivity type of the emitter zone, are implanted into the surface, with the etch masking layer 6 being used as an ion implantation mask. There is carried out an implantation of n-doping ions in a relatively high dose of $10^{15}$ to $10^{16}$ cm$^{-2}$ to obtain a high emitter efficiency.

Upon completion of the implantation process, the entire arrangement can be covered with a foreign oxide layer. Thereafter, the base zone diffusion is carried out together with the emitter zone diffusion by activating the dopings.

Following the application of the emitter contacts 9 and the base contacts 10, and after the semiconductor wafer has been divided, there will be obtained planar transistors as shown in FIG. 4 which are individually contacted and encapsulated in the conventional way.

To realize low-resistive collector terminals, an n-doped semiconductor wafer is used, in the method according to the invention, which has a relatively low-doped semiconductor layer on the one surface side of a high-doped substrate body.

What is claimed is:

1. A method for manufacturing bipolar planar transistors on a semiconductor wafer of the n-conductivity type, which is to be divided into the individual planar transistors, in which method the extrinsic base zones are produced by the implantation of p-doping ions, said method comprising the steps of:

covering the emitter areas with oxidation masking layer portions, thereafter depositing a photoresist mask defining the total-base areas thereafter subjecting said wafer to two implantation steps of p-doping ions, whereby in one of said two steps p-doping ions are implanted in the exposed outer extrinsic base areas at a relatively low accelerating voltage and a relatively high dose, and in the other of said two steps p-doping ions are implanted in a small dose into the exposed extrinsic base areas and into the remaining total-base areas at such a high accelerating voltage that the oxidation masking layer portions covering the emitter areas are penetrated;

removing the photoresist mask;

covering the extrinsic base areas with an etch masking layer which is resistive to the etching of the oxidation masking layer portions;

etching the oxidation masking layer portions;

implanting dopings of the conductivity type of the emitter zones; and diffusing the base zones and the emitter zones by activating the dopings.

2. A method in accordance with claim 1 comprising the subsequent steps of attaching one contact pad each to the emitter zones and the base zones;
dividing the semiconductor wafer into semiconductor chips each containing one pair of contact pads.

3. A method in accordance with claim 1, wherein said oxidation masking layer portions are silicon nitride and that said etch masking layer is produced by thermal oxidation of the one semiconductor surface of the extrinsic base areas.

4. A method in accordance with claim 1 wherein said semiconductor wafer comprises on its one semiconductor surface a high-resistive semiconducting layer into which the base zones are introduced.

5. A method in acccordance with claim 2, wherein said semiconductor wafer comprises on its one semiconductor surface a high-resistive semiconducting layer into which the base zones are introduced.

6. A method in accordance with claim 3, wherein said semiconductor wafer comprises on its one semiconductor surface a high-resistive semiconducting layer into which the base zones are introduced.

* * * * *